United States Patent [19]
Simmons, III

[11] Patent Number: 5,286,604
[45] Date of Patent: Feb. 15, 1994

[54] SINGLE LAYER DRY PROCESSIBLE PHOTOTHERMAL-SENSITIVE ELEMENT

[75] Inventor: Howard E. Simmons, III, Newark, Del.

[73] Assignee: E. I. Du Pont de Nemours and Company, Wilmington, Del.

[21] Appl. No.: 981,346

[22] Filed: Nov. 25, 1992

[51] Int. Cl.$^5$ .................. G03C 1/73; G03F 7/004
[52] U.S. Cl. .................. 430/286; 430/270; 430/281; 430/910; 430/944; 525/932
[58] Field of Search .............. 430/270, 281, 910, 944, 430/945, 176, 286; 524/82, 110, 560; 525/932

[56] References Cited

U.S. PATENT DOCUMENTS

| | | | |
|---|---|---|---|
| 3,563,738 | 2/1971 | Itano et al. | 96/28 |
| 4,294,909 | 10/1981 | Lee | 430/291 |
| 4,346,162 | 8/1982 | Abele | 430/270 |
| 4,356,252 | 10/1982 | Lee | 430/270 |
| 4,364,986 | 12/1982 | Zwanenburg et al. | 428/156 |
| 4,508,811 | 4/1985 | Gravesteijn et al. | 430/270 |

OTHER PUBLICATIONS

R. E. Kellogg et al. "CREO/Crosfield Interface for IR Diode Thermal Imaging," IS&T Second Symposium on Electronic Prepress Technology and Color Proofing, Sep. 11–14, 1991 (Chicago, IL).

*Primary Examiner*—Paul R. Michl
*Assistant Examiner*—Tae H. Yoon

[57] ABSTRACT

A photothermal-tackifiable composition, useful as a coating on a substrate, consisting of an optically clear blend of two or more polymers, one or more of which is capable of undergoing a thermochemical reaction, and a photothermosensitive compound, an infrared absorbing dye that generates locally high heat on exposure to infrared or near-infrared radiation, is disclosed. Also disclosed is a process for coating such a composition on a support, exposing the composition to infrared radiation and toning the imagewise exposed composition A "peel-apart" embodiment is also disclosed.

10 Claims, No Drawings

SINGLE LAYER DRY PROCESSIBLE PHOTOTHERMAL-SENSITIVE ELEMENT

FIELD OF THE INVENTION

This invention concerns a direct single-layer photothermal-tackification composition useful as a coating for an imaging element Also disclosed is a peel-apart tonable element. The primary application for the composition or imaging element(s) described herein is in the graphic arts area for the reproduction of negative images using a near-infrared diode laser imaging source.

TECHNICAL BACKGROUND

There are three types of offpress color proofing systems in use. These are overlay, integral (or single sheet) and electronic (or digital) These proofing systems are described in "Principles of Color Proofing", M. H. Bruno, Gama Communications, Salem, N.H. 1986. In digital proofing systems, the individual color separation images are digitalized and either combined to produce a composite three-color soft proof on a color monitor, cathode ray tube, or video display terminal, or, as in the present invention, converted to a hard proof on a color proofing medium. In order to form a colored image on the medium, toner is added that adheres to the medium in defined areas One way of causing toner to adhere to the medium is to form a "tacky" image that will adhere to toner.

The use of light to cause "imagewise" formation of tackiness in a film is known as photo-tackification. Similarily, the use of infrared or near-infrared radiation to cause "imagewise" formation of tackiness is known as photothermal-tackification. The tacky image that is produced in the area exposed to infrared or near-infrared radiation can be made readily visible and read out by applying toner particles to the tacky surface. Toning of the tacky surface is possible using dry powders, for instance the Cromalin ® toning agents, available from E. I. duPont de Nemours and Company, Wilmington, Delaware. The toner particles selectively adhere to tacky regions on a surface, thus providing negative-working materials. Such coatings can also be used on a substrate that is peelably attached, for example by lamination, to a toner-transfer foil, using such foils as Eurosprint ® (registered in the United States as Color-Trax ®) which are available from E. I DuPont de Nemours and Company. In these peel-apart elements, upon exposure of the element to infrared radiation, tackiness results on the substrate. Toner particles from the toner-transfer foil selectively adhere to the tacky regions generated on the substrate. When the substrate is separated from the foil, toner particles remain on the tacky regions of the substrate, thus providing the basis for negative-working color materials.

Examples of materials that directly result in tackiness upon irradiation with light or with infrared or near-infrared radiation are rare. Most negative working systems require a separate wet development step. The present composition achieves its tackiness because of the ability of a selected miscible polymer blend to undergo a photothermochemical change that results in a microphase separation of a tacky polymer from a nontacky polymer, thereby eliminating the need for a separate wet development step.

R. E. Kellogg, H. Zwicker and J. Wall, "CREO/Crosfield Interface for IR Diode Thermal Imaging," IS&T Second Symposium on Electronic Prepress Technology and Color Proofing, Sep. 11-14, 1991 (Chicago, Ill.) disclose apparatus for thermal imaging using diode lasers.

U.S. Pat. No. 4,364,986 discloses a dye containing layer of a film-forming polymeric binder useful as optical filters and optical information recording elements.

U.S. Pat. No. 4,508,811 discloses a recording element having a pyrylium or thiopyrylium-squarylium dye layer and new pyrylium or thiopyrylium-squarylium dye compounds.

U.S. Pat. No. 3,563,738 discloses a reproduction material which combines a first tacky component and a light sensitive component which upon exposure to actinic radiation, changes the heat-activatability and thermal properties of the first component.

U.S. Pat. No. 4,356,252 teaches a photosensitive element useful for making color proofs comprising a support bearing a layer of negative-working tonable photoimaging composition comprising at least one organic polymeric binder, a photosensitizer which forms an acid upon exposure to actinic radiation, and at least one acetal compound wherein the polymeric binder is plasticized. U.S. Pat. No. 4,294,909 teaches a process for preparing negative tonable images comprising exposing imagewise a photosensitive element bearing a layer of negative-working tonable image composition as in U.S. Pat. No. 4,356,252. The principle involved in U.S. Pat. No. 4,356,252 and U.S. Pat. No. 4,294,909 is that a photogenerated acid decomposes a (solid) nonpolymeric acetal compound(s) and the resulting liquid products plasticize the binder so that $T_g$ is lowered and the binder becomes tacky enough to be toned. These patents differ from the present invention which is imagewise exposed by infrared or near infrared radiation and which achieves its tackiness as the result of the unmasking of a tacky polymer present in the composition, which has been previously masked by the presence of a nontacky polymer.

U.S. Pat. No. 4,346,162 discloses a nonsilver reproduction element for preparing negative tonable images which comprises a support bearing a layer of photosensitive composition comprising at least one thermoplastic binder and at least one thio compound U.S. Pat. No. 5,019,549 uses "SQS" as an infrared absorber in a colorant transfer system.

SUMMARY OF THE INVENTION

The present invention concerns a photothermaltackifiable composition useful as a coating on a substrate. The composition comprises an optically clear blend of two or more polymers, one or more of which is capable of undergoing a thermochemical reaction with an infrared absorbing compound, such as an infrared dye, that generates a locally high temperature on imagewise exposure to infrared or near-infrared radiation. The invention also relates to a process for coating such a composition on a support, for toning the imagewise exposed composition on a support and also to a peel-apart tonable element. The compositions described herein are useful as a single-layer approach to digital proofing. Good imaging characteristics for these materials have been demonstrated on a diode-laser-modified Crosfield scanner.

The composition comprises:

(a) at least one first polymer that is tacky as a result of having a glass transition temperature $T_g$ of below room temperature;

(b) at least one second polymer, miscible with the first, that has a $T_g$ sufficiently far above room temperature so that the blend of first and second polymer(s) is not tacky at room temperature, said second polymer(s) having functional groups that are sensitive to heat, such that the reaction of these functional groups in the presence of the imagewise generated heat results in a polymer that is immiscible with the tacky polymer in the blend; and (c) a near-infrared absorbing dye that upon exposure to near-infrared radiation generates locally intense heat.

Other ingredients, such as plasticizers, pigment dispersants, surfactants, and coating aids may be present in the composition, as long as they are compatible with the existing ingredients and do not alter the adhesive relationship of the existing ingredients. In order for the invention to be operable, the low $T_g$ tacky polymer(s) must be sufficiently soluble in the higher $T_g$, acid labile polymer(s), so that an optically clear, non-tacky coating can be obtained Preferred heat sensitive functional groups react to generate carboxylic acid groups or phenolic groups to result in a polymer that is immiscible with the tacky polymer in the blend.

Also disclosed is a photothermal sensitive element comprising a dimensionally stable substrate coated with a coating comprising a blend of (a) a first polymer, said first polymer having a glass transition temperature below room temperature; and (b) a second polymer, said second polymer being miscible with said first polymer and having a sufficiently high glass transition temperature that said blend is not tacky at room temperature; and (c) an infrared absorbing material wherein upon exposure to infrared radiation said second polymer is thermally converted to a third polymer that is immiscible with said first polymer, so that imagewise exposed regions can become tacky.

The invention further concerns a process for creating a tonable surface comprising the steps of I. dissolving in a solvent:

a) at least one first polymer or copolymer that is tacky as a result of having a glass transition temperature $T_g$ of below room temperature;

b) at least one second polymer, miscible with the first polymer or copolymer, that has a $T_g$ sufficiently far above room temperature so that a substantially solvent free blend of first and second polymer(s) is not tacky at room temperature, said second polymer having functional groups that are sensitive to heat such that the reaction of functional groups in the presence of imagewise generated heat results in the formation of a third polymer that is immiscible with the first tacky polymer in the blend;

c) a near-infrared dye that upon exposure to near-infrared radiation generates locally intense heat;

II. coating a substrate with the solution of step I and removing substantially all of the solvent;

III. irradiating the coated substrate to generate heat which results in a tacky tonable surface. Preferred functional groups on the second polymer generate carboxylic acid or phenolic groups causing the third polymer formed to be immiscible with the first polymer.

Also disclosed is a process for forming a peel-apart toned surface comprising the steps of I. dissolving in a solvent:

a) at least one first polymer or copolymer that is tacky as a result of having a glass transition temperature $T_g$ of below room temperature;

b) at least one second polymer, miscible with the first polymer or copolymer, that has a $T_g$ sufficiently far above room temperature so that a substantially solvent free blend of first and second polymer(s) is not tacky at room temperature (about 18° C. to about 22° C.), said second polymer(s) having functional groups that are sensitive to heat such that the reaction of functional groups in the presence of imagewise generated heat results in the formation of a third polymer that is immiscible with the first tacky polymer in the mixture;

c) a near-infrared dye that upon exposure to near-infrared radiation generates locally intense heat;

II. coating a dimensionally stable substrate with the the solution generated in step I and removing substantially all of the solvent;

III. adhering said coated substrate to a comparable sized piece of toner transfer material;

IV. imagewise irradiating the coated substrate, that is adhered to the toner transfer foil, with near-infared radiation, so as cause the generation of heat and result in irradiated regions on the surface becoming tacky, said tacky surfaces adhering to toner material located on the toner transfer foil;

V. peeling the coated substrate apart from the toner transfer foil, resulting in the toning of irradiated regions on the substrate.

The invention also concerns a peel-apart photothermal sensitive element comprising a dimensionally stable substrate coated with a coating comprising a blend of (a) a first polymer, said first polymer having a glass transition temperature below room temperature; and (b) a second polymer, said second polymer being miscible with said first polymer and having a sufficiently high glass transition temperature that said blend is not tacky at room temperature; and (c) an infrared absorbing material; wherein upon exposure to infrared radiation said second polymer is thermally converted to a third polymer, preferrably having carboxylic acid or phenolic groups, said third polymer being immiscible with said first polymer, so that imagewise exposed regions become tacky, wherein said substrate is adhered to a piece of toner transfer foil of comparable size.

The invention also discloses a process for forming a colored image, said process comprising, in order:

A) imagewise exposing with infrared radiation, a composition as described above, coated on a substrate, said exposure causing the imagewise exposed regions to become tacky; and B) toning said imagewise exposed regions with a colorant.

By miscible herein is meant having the tendency or capacity to form a uniform blend, e.g. forming an optically clear, nontacky film. By immiscible is meant not blending with each other, e.g. forming a tacky film.

DETAILED DESCRIPTION OF THE INVENTION

This invention consists of a composition, as described above, useful as a coating on a substrate, preferably polyester film e.g., Mylar ®, of an optically clear blend of two or more polymers, at least one polymer with a low glass transition temperature $T_g$, below room temperature, and a second with a high $T_g$, and a near-infrared sensitive dye that generates intense heat upon exposure to near-infrared radiation.

It has been found that certain polymers of low $T_g$ are tacky and certain polymers of high $T_g$ with pendant thermolabile groups are non-tacky. By blending the two, a non-tacky optically clear film can be prepared. If an infrared absorbing dye is mixed with such a polymer blend, the composition is subject to imagewise tackification when the dye material heats up due to the dye material's absorption of near-infrared radiation. The thermoloabile polymer of high $T_g$ will "thermoreact", causing it to become immiscible with the tacky polymer of low $T_g$ and resulting in a tacky surface. It is thought that surface tackiness occurs because the tacky low $T_g$ material migrates to the surface of the film. The surface is thus provided with a material that can selectively attract toner particles.

Examples of polymers having low $T_g$, i.e. below room temperature are poly(2-phenylethyl acrylate) (PPEA) and poly(3-phenyl-1-propyl acrylate) (PPPA). The low $T_g$ polymer must be sufficiently miscible with the higher $T_g$, thermolabile polymer(s), so that an optically clear, non-tacky coating is obtained The tacky (co)polymers having Tg below room temperature may be prepared by any known polymerization method, for example addition polymerization, condensation polymerization or ring opening polymerization and must be soluble to some extent in the thermolabile polymers so that an optically clear coating of the polymer blend can be obtained. The proportion of polymers in the blend are adjusted so that the blend is maintained tack-free and optically clear at ambient temperature. For example, a tertiary blend of 25% poly(tetrahydro-2-pyranyl methacrylate) (PTHPMA), 25% poly(tetrahydro-2-pyranyl acrylate) (PTHPA) and 50% tacky poly(2-phenylethyl acrylate) (PPEA) gives a non-tacky optically clear film at ambient temperature. In the presence of heat, PTHPMA and PTHPA form poly(methacrylic acid) and poly(acrylic) acid, respectively, which are not miscible with tacky PPEA. The tacky PPEA forms a separate phase and is able to attract toner particles. The preparation of THP polymers is disclosed in J. E. Kearns et al., J. Macromol., Sci.-Chem. A 8(4), 673–685, 1974 and in U.S. Pat. No. 5,071,731.

Typically, the $T_g$ of the blend is higher than that of the tacky polymer and lower than that of the thermolabile polymer.

It is preferred that the molecular weight of the tacky polymer(s) be less than 30,000 g/mol.

The thermolabile group of the high $T_g$, thermolabile polymer is an acetal ester, t-butyl ester, t-butoxy-carbonyloxy derivative of a phenol, or an acetal ether of a phenol. It is preferred that the molecular weight of the thermolabile (co)polymer(s) be less than about 30,000 g/mol.

In order for coating composition herein to be imaged by exposure to near infrared radiation, the coating composition must contain an infrared absorbing material, such as an infrared absorbing dye. The near-infrared absorbing dye of this invention generates locally intense heat when exposed to near-infrared radiation. The infrared absorbing material must have a strong absorption in the emission region of the exciting laser (typically about 750–870 nm) and should have sufficient thermal stability so that it does not degrade image quality. For color applications, it is preferred that the infrared absorbing material used be essentially non-absorbing in the visible radiation range so that small amounts used will not affect the color quality of the image.

Numerous infrared absorbing materials are known. (See, for example, Infrared Absorbing Materials, M. Matsuoka, Ed, Plenum, New York, 1990). Examples of compounds and mixtures which can be used as infrared dyes include thiopyrylium,4-[[3-[[2,6-bis(1,1-dimethylethyl)-4H-thiopyran-4-ylidene]methyl]-2-hydroxy-4-oxo-2-cyclobuten-1-ylidene]methyl]2,6-bis(1,1-dimethylethyl)-hydroxide,inner salt (See directly below).

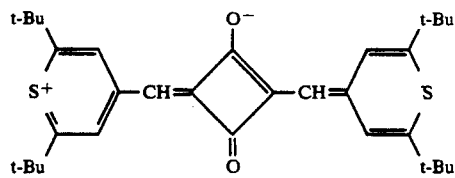

The time required for development of tackiness, following exposure of the above described compositions to near-infrared radiation, will vary depending upon the composition of the coating, the relative humidity, temperature, and whether or not various post-exposure treatments are employed. In general, it is instantaneous.

The coatings of the photothermal sensitive polymer blends described herein may be prepared by any standard technique including roller coating, drawdown of a solution, extrusion or by spincoating a solution.

The photothermal sensitive composition described above may be applied to various support materials including, but not limited to paper, cardboard, metal sheets, wood, glass, and films or fiber webs of natural or synthetic polymers. The support may be transparent or opaque. The coating may be applied with or without a top coating of protective film to protect the thermosensitive coating. It is also possible to include additional layers or components.

The components of the photothermal sensitive layer are applied to the support either as a solution in volatile solvents or without the use of solvents. Solvents for use on supports include 2-butanone, acetone, methylene chloride, tetrahydrofuran, and ethyl acetate. Applications for which no solvent is required include calendering and extruding. Upon exposure to near infrared radiation the thermolabile polymers are rapidly converted to carboxylic acid or phenolic polymers which are not miscible with the tacky polymer. When microseparation of the phases occurs, it is believed that the tacky phase migrates to the surface of the film in the exposed areas creating a surface that can be toned.

The concentration of the nonvolatile components of the coating solution can fluctuate within broad limits, but is dependent on the coating method and the thickness desired for the different purposes of application.

To tone the imagewise exposed photothermal sensitive layer, powdered dyes and/or pigments of many different types can be used. For example, inorganic or organic pigments are suitable as are soluble organic dyes. The individual dye particles can be provided with a protective layer of a suitable polymeric material for the purpose of improving handling. Suitable toners are described, for example, in U.S. Pat. Nos. 3,060,024, 3,620,726, and 3,909,282 which are incorporated herein by reference. Colorant may be applied by a transfer process, such as described in U.S. Pat. No. 3,060,025, or by using colored toning film as described in U.S. Pat. No. 4,806,451.

The toning procedure is either implemented manually, e.g., by means of a cotton pad, or a special application device. The image can, in this case, be produced directly on the support, which carries the thermosensitive layer. If desired, the toned image can be transferred to another material by lamination. According to another embodiment, the photosensitive layer is transferred to the final support prior to exposure and there exposed and toned. Depending on the selection of support material, non-transparent as well as transparent images can be produced. For the production of multicolored images several images toned in the individual colors are coated or laminated over each other.

Exposure of the photothermal-sensitive layer is accomplished by using near-infrared radiation sources. Direct writing with suitable lasers is also useful. The amount of exposure required for satisfactory reproduction is a function of the nature and concentration of the infrared sensitive dye, optional sensitizers, the thermolability of the thermolabile polymer in the thermosensitive layer, the type of radiation source used, and the distance between the radiation source and layer surface. In general, exposure times range from about 4 seconds to 2 minutes using standard commercial radiation sources.

Although various types of lasers may be used for exposure as described herein, diode lasers emitting in the region of 750 to 880 nm offer substantial advantages in terms of their small size, low cost, stability, reliability, ruggedness and ease of modulation. Diode lasers emitting in the range of 800 to 880 nm are preferred. Such lasers are commercially available from, for example, Spectra Diode Laboratories (San Jose, Calif.).

The composition of this invention may be used to prepare overlay and integral (surprint) proofs. These images are especially useful in the graphics arts field wherein proofs are prepared to duplicate the images produced by printing. A typical proof consists of yellow, magenta, cyan, and black images, each produced from a corresponding color separation.

To prepare a multicolor overlay proof, a series of one color images is prepared. A series of elements, each consisting of a layer of the imageable composition (photothermal-tackification composition herein) on a transparent support such as clear polyethylene terephthalate film, is imagewise exposed. Each exposed element is toned with a toner than corresponds to the color separation used for exposure. The colored images are stacked in register on a white background, or receptor, to produce an overlay proof. Precolored and toned images may be combined as described in Matthews, U.S. Pat. No. 5,001,037, incorporated herein by reference.

To prepare an integral or surprint proof, a series of colored images may be prepared as above and adhered in register to a receptor (the laminate in register process). Adhesive may be added to adhere the images together and to the receptor, or each element may comprise a separate adhesive layer.

Alternatively, the element may comprise, in order, a temporary release film (such as silicon release treated polyethylene terephthalate), an adhesive layer, the layer of imageable composition (e.g. the photothermal-tackification composition herein), and a support. The temporary release film is removed from a first element and the adhesive layer adhered to a receptor and the support removed. The photosensitive layer is exposed and toned. The temporary release film is removed from a second element, and the adhesive layer laminated to the previously formed image. The support is removed, the layer of imageable composition exposed in register with the first image and toned. The process repeated as many times as desired to form a multicolored surprint proof (expose in register process). Other methods for preparing multicolored images, such as are described in Choi, U.S. Pat. No. 5,001,036, and the transfer process described in Platzer, U.S. Pat. No. 5,094,931, both of which are incorporated herein by reference, will be apparent to those skilled in the art.

The receptor may be any material that has the necessary stiffness dimensional stability and exhibits the necessary adhesion to the adhesive required for preparation of the image. The receptor is flat and preferably smooth and opaque. Exemplary materials which may be used as the receptor include opaque polyethylene terephthalate film base, e.g., Melinex ® 994 (ICI Americas, Wilmington, Del.); and paper stock, e.g., Kromekote ® opaque white paper (Champion Paper Co., Stamford, Conn.), or Cromalin ® receptor stock (Du Pont, Wilmington, Del.). Paper which has been removably applied to a dimensionally stable support, as described in Osenegg, U.S. Pat. No. 5,053,313, may be used as the receptor. This allows the image to be prepared on any desired receptor stock.

SQS in the below example, is thiopyrylium,4-[[3-[[2,6-bis(1,1-dimethylethyl)-4H-thiopyran-4-ylidene]-methyl]-2-hydroxy-4-oxo-2-cyclobuten-1-hydroxide,inner salt. It was prepared as described in U.S. Pat. No. 4,508,811, which is incorporated herein by reference.

EXAMPLE 1

Photothermal-tackification Film and Imaging

A solution of 0.340g of poly(2-phenylethyl acrylate) [$M_n$=10,000, $M_w$=23,100,$M_w/M_n$=2.31], 0.180 g of poly(tetrahydro-2-pyranyl methacrylate) [$M_n$=6510, $M_w$=10,900, $M_w/M_n$=1.69], 0.180 g of poly(tetrahydro-2-pyranyl acrylate) [$M_n$=14,400, $M_w$=35,300, $M_w/M_n$=2.45], and 0.030 g of SQS dye in 4.0 g of 2-butanone was prepared and filtered through a 5.0 micron Millex ®-LS (Millipore Products Div.) syringe filter. The solution was coated on 2 mil (0.05 mm) thick Mylar ® polyester film using a 2 mil doctor blade to give, after air drying, a 3–4 micron non-tacky film. The coatings were imaged in air on a Crosfield 646 scanner retrofitted with a CREO (Vancouver, BC) writehead using an array of 36 infrared lasers emitting at 830 nm (Sanyo Semiconductor, SDL-7032-102, Allendale, N.J.). A half-tone-dot step wedge test pattern was reproduced using 300–600 mJ/cm$^2$ of incident laser irradiation. Visible images were obtained. Toning was accomplished using conventional Cromalin ® powders or by lamination at 50°–70° C. using Eurosprint ® toner transfer foils. Dot scale obtained was 2–98% (150 lines per inch screen).

EXAMPLE 2

A sample of the film prepared in Example 1 was prelaminated to a comparable-sized piece of the Eurosprint ® toner-transfer foil using a roll temperature of 50° C.–70° C. Upon cooling to room temperature the laminate had adequate adhesion to be handled in use and could be cleanly separated by peeling apart. When exposed substrate-incident (through the Mylar ® support) on the modified Crosfield scanner using 600 mJ/cm$^2$ of laser energy and then separated, toner selectively remained on the film in imaged areas.

What is claimed is:

1. A coating composition for use on a substrate comprising an optically clear blend of two or more polymers or copolymers with a near-infrared dye that generates intense heat locally upon imagewise exposure to near-infrared radiation, wherein the optically clear blend comprises:

(a) at least one first polymer or copolymer that is tacky as a result of having a glass transition temperature $T_g$ of below room temperature;

(b) at least one second polymer or copolymer miscible with the first polymer, said second polymer having a $T_g$ sufficiently far above room temperature so that the blend of first and second polymer(s) is not tacky at room temperature, said second polymer(s) having functional groups that are sensitive to heat, such that the reaction of functional groups in the presence of the imagewise generated heat results in a third polymer that is immiscible with the tacky polymer in the blend; and (c) a near-infrared dye that upon exposure to near-infrared radiation generates locally intense heat.

2. The composition of claim 1 wherein the low $T_g$ first polymer is poly(2-phenylethyl acrylate) or poly(3-phenyl-1-propyl acrylate).

3. The composition of claim 1 wherein the functional groups on the second polymer react to form carboxylic acid groups or phenolic groups.

4. The composition of claim 1 in which the polymers are prepared by a method selected from the group consisting of addition polymerization, and condensation polymerization.

5. The composition of claim 1 wherein the number average molecular weight of the first polymer or copolymer is less than about 30,000 g/mol.

6. The composition of claim 1 wherein the $T_g$ of the blend is higher than that of the tacky polymer and lower than that of the thermolabile polymer.

7. The composition of claim 1 wherein the second polymer is selected from the group consisting of an acetal ester, t-butyl ester, t-butoxycarbonyloxy derivative of a phenol, and an acetal ether of a phenol.

8. The composition claim 1 wherein the near-infrared sensitive dye is: thiopyrylium,4-[[3-[[6-bis(1,1-dimethylethyl)-4H-thiopyran-4-ylidene]methyl]-2-hydroxy-4-oxo-2-cyclobuten-1-ylidene]methyl]2,6-bis(1,1-dimethylethyl)-hydroxide, inner salt.

9. The composition of claim 1 wherein the number average molecular weight of the second polymer or copolymer is less than 30,000 g/mol.

10. The composition of claim 1 in a solvent selected from the group consisting of 2-butanone, acetone, methylene chloride, tetrahydrofuran and ethyl acetate.

* * * * *